(12) United States Patent
Ohta (10) Patent No.: US 7,458,820 B2
(45) Date of Patent: Dec. 2, 2008

(54) SOCKET, SOCKET BASE AND METHOD FOR OPERATING AND TESTING

(75) Inventor: Toshio Ohta, Tokyo (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/092,481

(22) PCT Filed: Nov. 13, 2006

(86) PCT No.: PCT/US2006/044081

§ 371 (c)(1),
(2), (4) Date: May 2, 2008

(87) PCT Pub. No.: WO2007/061675

PCT Pub. Date: May 31, 2007

(65) Prior Publication Data
US 2008/0261431 A1    Oct. 23, 2008

(30) Foreign Application Priority Data
Nov. 18, 2005 (JP) ............................ 2005-334443

(51) Int. Cl.
*H01R 12/00* (2006.01)

(52) U.S. Cl. ........................................ 439/73; 439/331
(58) Field of Classification Search .................. 439/73, 439/330, 331
See application file for complete search history.

(56) References Cited

U.S. PATENT DOCUMENTS

| 5,498,970 | A | 3/1996 | Peterson |
| 6,752,645 | B2 | 6/2004 | Nakamura et al. |
| 7,214,084 | B2 * | 5/2007 | Hayakawa ................. 439/331 |
| 7,278,868 | B2 * | 10/2007 | Sato et al. .................... 439/259 |
| 2001/0053628 | A1 | 12/2001 | Hayakawa |
| 2002/0106925 | A1 * | 8/2002 | Yamagishi ................. 439/331 |
| 2003/0109163 | A1 | 6/2003 | Shimada |
| 2003/0171021 | A1 * | 9/2003 | Okamoto ..................... 439/331 |

FOREIGN PATENT DOCUMENTS

| JP | 12030817 | 1/2000 |
| JP | 2001-228204 (A) | 8/2001 |

* cited by examiner

*Primary Examiner*—Tho D Ta
(74) *Attorney, Agent, or Firm*—Melanie G. Gover (57) ABSTRACT

A purpose of the invention is to provide a socket and a socket base, capable of holding the retainers outside the viewing field of the camera in spite of the size and/or shape of the retainers when measuring contact gaps, for example.

4 Claims, 10 Drawing Sheets

SOCKET, SOCKET BASE AND METHOD FOR OPERATING AND TESTING

TECHNICAL FIELD

The present invention relates to a socket with a plurality of contacts corresponding to a plurality of terminals provided on a bottom surface of an integrated circuit device such as a ball grid array (BGA) device. Also, the present invention relates to a socket base for use with the socket. Further, the present invention relates to a method for using and operating the socket and the socket base and a method for testing the socket.

BACKGROUND

A patent document 1 discloses a socket for a temporal connection of a ball grid array (BGA) integrated circuit device to a test circuit. The socket includes a pattern of contacts corresponding to a pattern of terminals, e.g., solder balls provided on a bottom surface of the integrated circuit device. Each of the contacts has a pair of tips for resiliently nipping an associated one of the solder balls of the integrated circuit device. The socket also has structures for moving each pair of contact tips between an opened position in which the contact tips are spaced apart from each other to accommodate the associated solder ball therebetween and a closed position in which the contact tips resiliently hold the associated solder ball therebetween.

A patent document 2 discloses another socket including one or more pairs of retainers for forcing the integrated circuit device against the contacts to attain reliable contacts between the contacts of the socket and the associated solder balls of the integrated circuit device. Each of the retainers is supported for rotation between a protruded position in which each of the retainers is protruded above the upper surface of the integrated circuit to force the integrated circuit device against the contacts and a retracted position in which the retainer is fully retracted from above the integrated circuit device. A spring is provided for each retainer to force the retainer toward the protruded position.

The sockets have various advantages. Among other things, the retainers ensure reliable electrical contacts between the solder balls of the integrated circuit device and the associated contacts of the socket. However, when optically checking whether a sufficient opening or gap necessary for receiving the solder ball is formed between the opened contact tips and/or whether a predetermined physical condition is provided to each contact, the protruded retainers can intervene between the camera and a part of the contacts, inhibiting the measurement of the gaps of those contacts, depending upon the size and/or shape of the retainers. This requires that the retainers are retained in the retracted positions by means of exclusively designed tools before mounting the socket onto the test site. Also, a fitting and unfitting of the tool requires an extra effort and time.

In view of foregoing, a purpose of the present invention is to provide a socket, a socket base and methods for operating and testing the sockets, capable of holding the retainers outside the viewing field of the camera in spite of the size and/or shape of the retainers.

SUMMARY OF THE INVENTION

To attain this, the present invention is to provide a socket for an integrated circuit device, the socket having a plurality of contacts corresponding to a plurality of terminals mounted on a major surface of the integrated circuit device, comprising:

a base for supporting the contacts;

a plurality of retainers, each of the retainers being mounted on the base for movement between a projected position in which the retainer is projected into a region above the integrated circuit device mounted on the contacts to make a contact with an upper surface portion of the integrated circuit device and a retracted position in which the retainer is retracted out of the region above the integrated circuit device;

a plurality of springs, each of said springs being provided for biasing the retainer from the retracted position to the projected position;

wherein the base has a plurality of through-holes extending through the base, the through-holes being so positioned that, when pins are passed upwardly through the through-holes, respectively, the retainers are forced by the pins from the projected positions to the retracted positions.

Another aspect of the present invention is to provide a socket base for supporting the socket, wherein the socket base has the pins.

Another aspect of the present invention is to provide a method for operating retainers of a socket for an integrated circuit device, comprising the steps of:

(a) providing a socket including a base having through-holes extending through the base, a plurality of contacts mounted in the base, retainers mounted for movement between respective first positions in which the retainers are positioned above an integrated circuit device mounted on the contacts to retain the integrated circuit device on the contacts and respective second positions in which the retainers are retracted from above the integrated circuit device to release the integrated circuit device and springs for biasing the retainers from the respective second positions to the respective first positions;

(b) providing a socket base for supporting the socket, the socket base having pins corresponding to the through-holes;

(c) mounting the socket on the socket base so that the pins of the socket base are passed through the corresponding through-holes of the base to force the retainers from the respective first positions to the respective second positions against the springs; and (d) removing said socket from said socket base.

Another aspect of the present invention is to provide a method for testing a socket for an integrated circuit device, comprising the steps of:

(a) providing a socket having a base having through-holes extending through the base, a plurality of contacts mounted in the base, retainers mounted for movement between respective first positions in which the retainers are positioned above an integrated circuit device mounted on the contacts to retain the integrated circuit device on the contacts and respective second positions in which the retainers are retracted from above the integrated circuit device to release the integrated circuit device and springs for biasing the retainers from the respective second positions to the respective first positions;

(b) providing a socket base for supporting the socket, the socket base having pins corresponding to the through-holes;

(c) mounting the socket on the socket base while the pins of the socket base are passed through the corresponding through-holes of the base to force the retainers from the respective first positions to the respective second positions against the springs; and (d) removing the socket from the socket base.

According to the socket, socket base and the combination thereof, when the socket is mounted on the socket base, the pins of the socket base are passed through the corresponding through-holes of the base to force the corresponding retainers from the projected positions to the retracted positions. This allows that, when measuring the gaps of the contacts and/or the physical conditions of the contacts such as heights of the contact tips relative to the base, the optical device such as camera are capable of viewing and measuring the gaps and/or physical conditions of all contacts.

DETAILED DESCRIPTION

Figure 1:
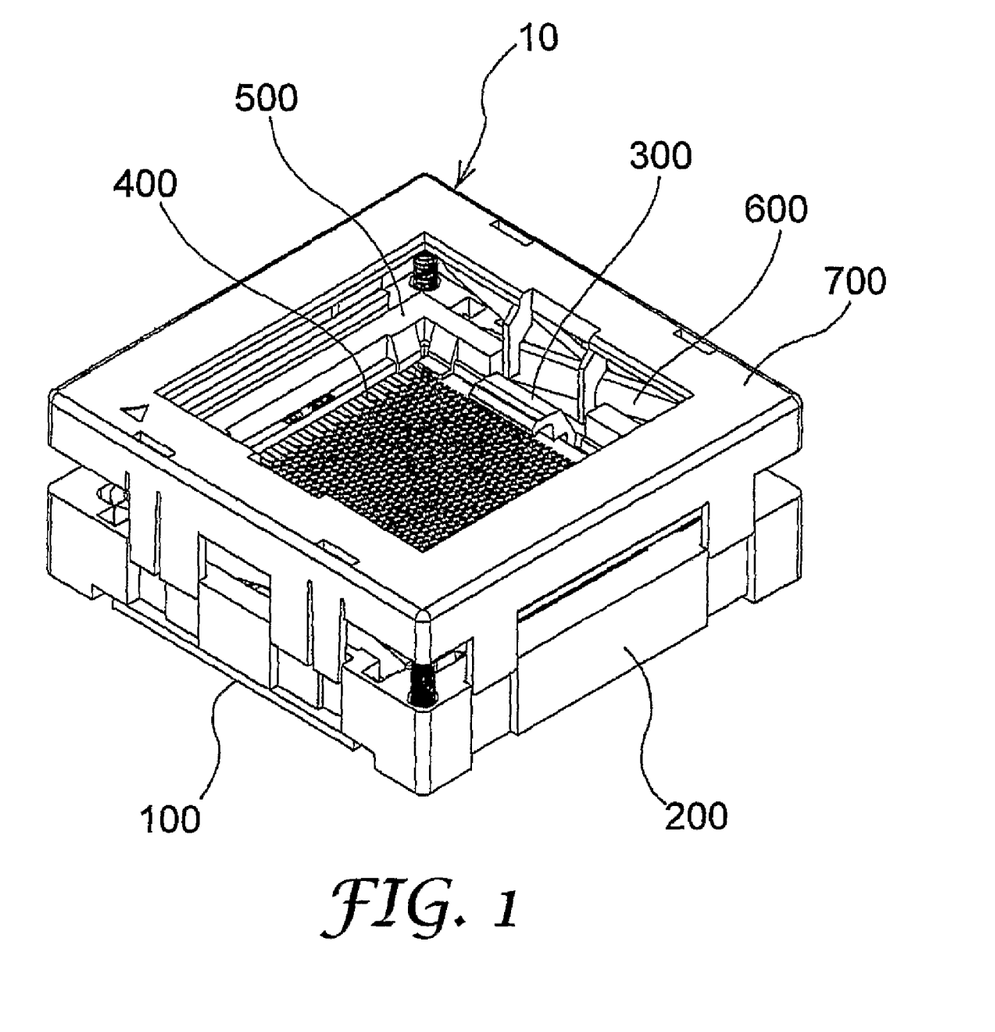
FIG. 1 is a perspective view of the socket according to the present invention.
Figure 2:
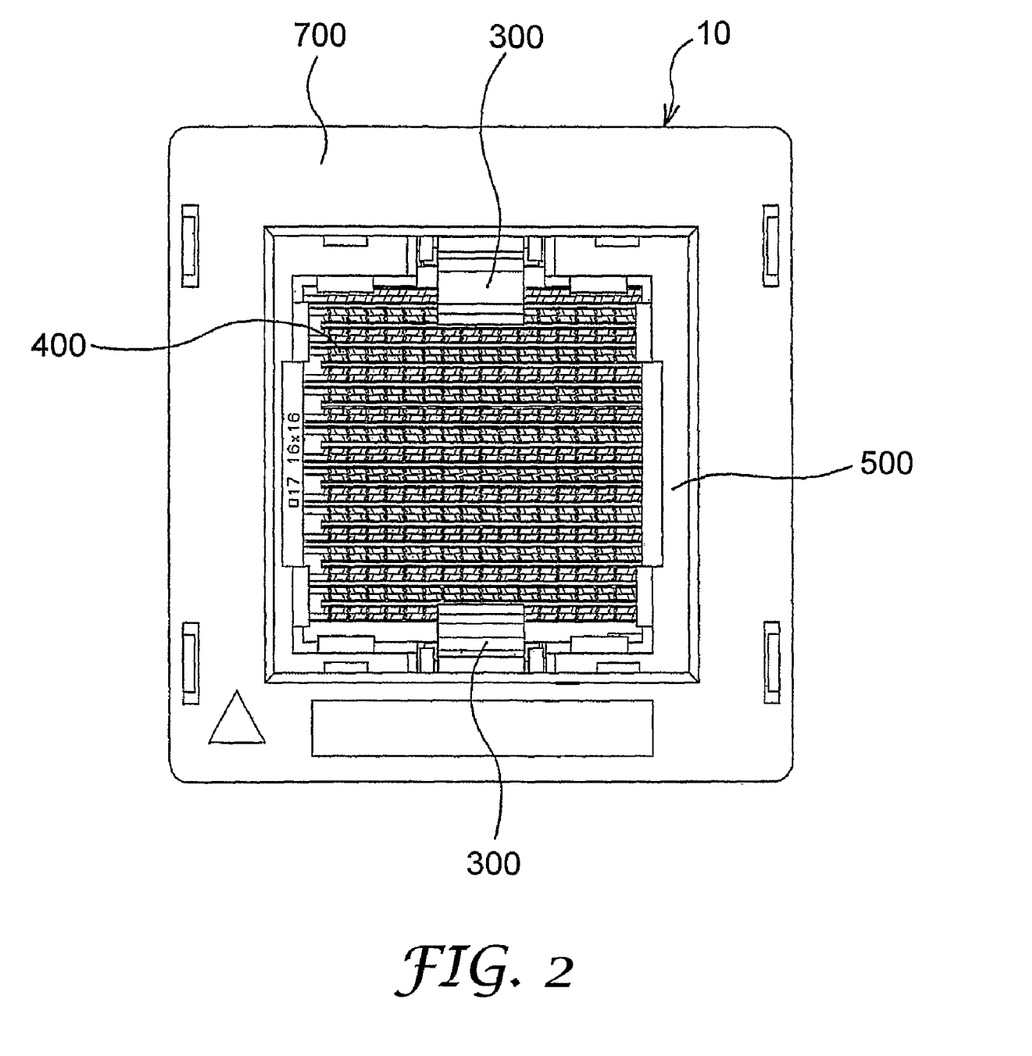
FIG. 2 is a plan view of the socket according to the present invention.
Figure 3:
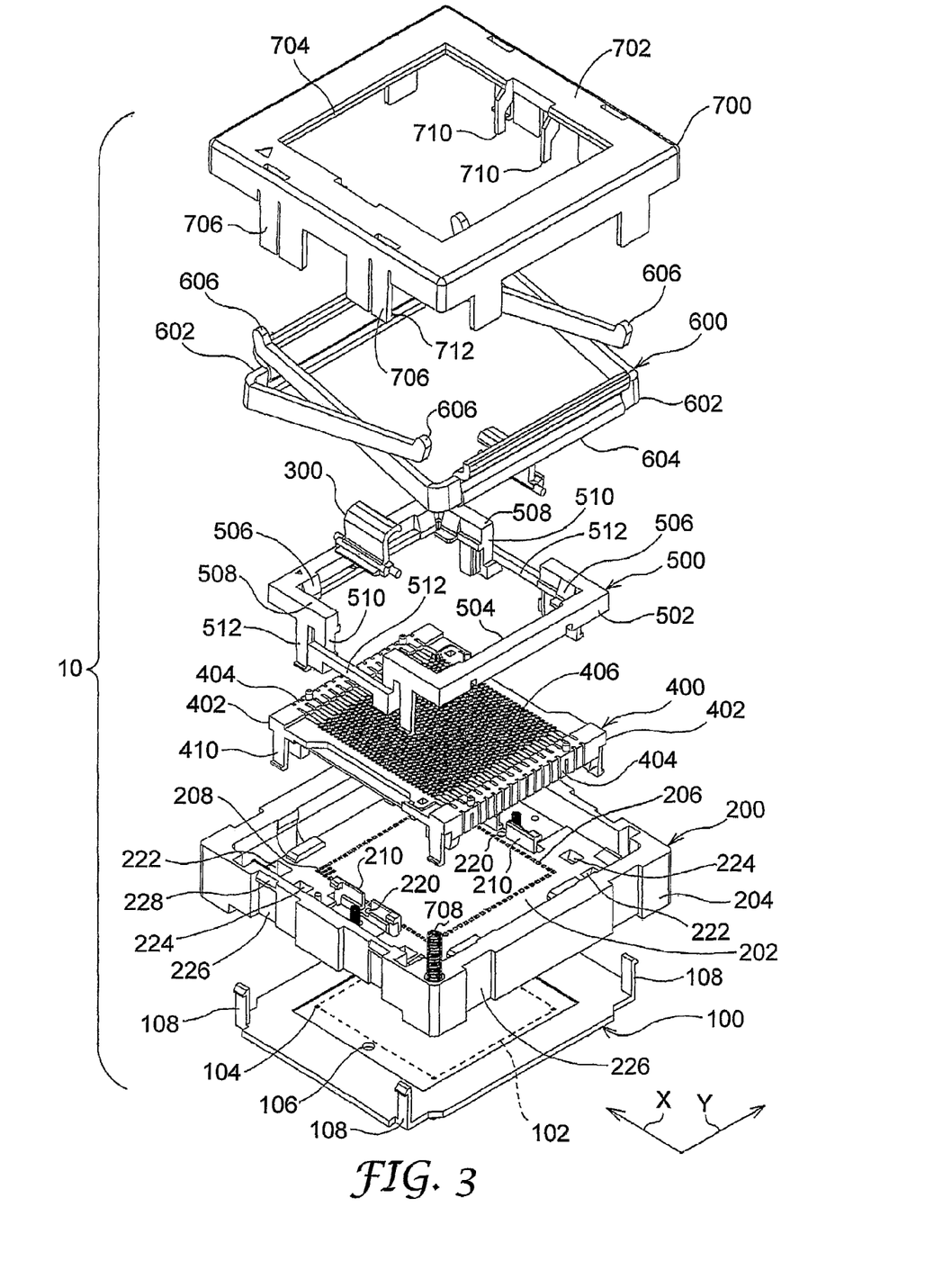
FIG. 3 is an exploded perspective view of the socket according to the present invention.

With reference to the accompanying drawings, several embodiments of the socket will be described below in connection with a specific operation for measuring contact gaps. Referring to FIGS. 1-3, in particular FIG. 3, a socket generally indicated by reference numeral 10 has an alignment plate 100, a base 200, retainers 300, a nest assembly 400, a guide frame 500, a lever assembly 600 and a top cover 700.

The alignment plate 100, which is in the form of substantially rectangular plate of electrically non-conductive material, has a rectangular, contact alignment region 102. The region 102 has a number of contact alignment holes 104 arranged in a grid, at regular intervals in the orthogonal X- and Y-directions. The plate 100 also has through-holes 106 each extending vertically between top and bottom surfaces of the alignment plate 100 and provided adjacent and outside the central portion of the opposite edges of the rectangular region 102 (one of the through-holes is omitted from the drawing.)

Figure 4:
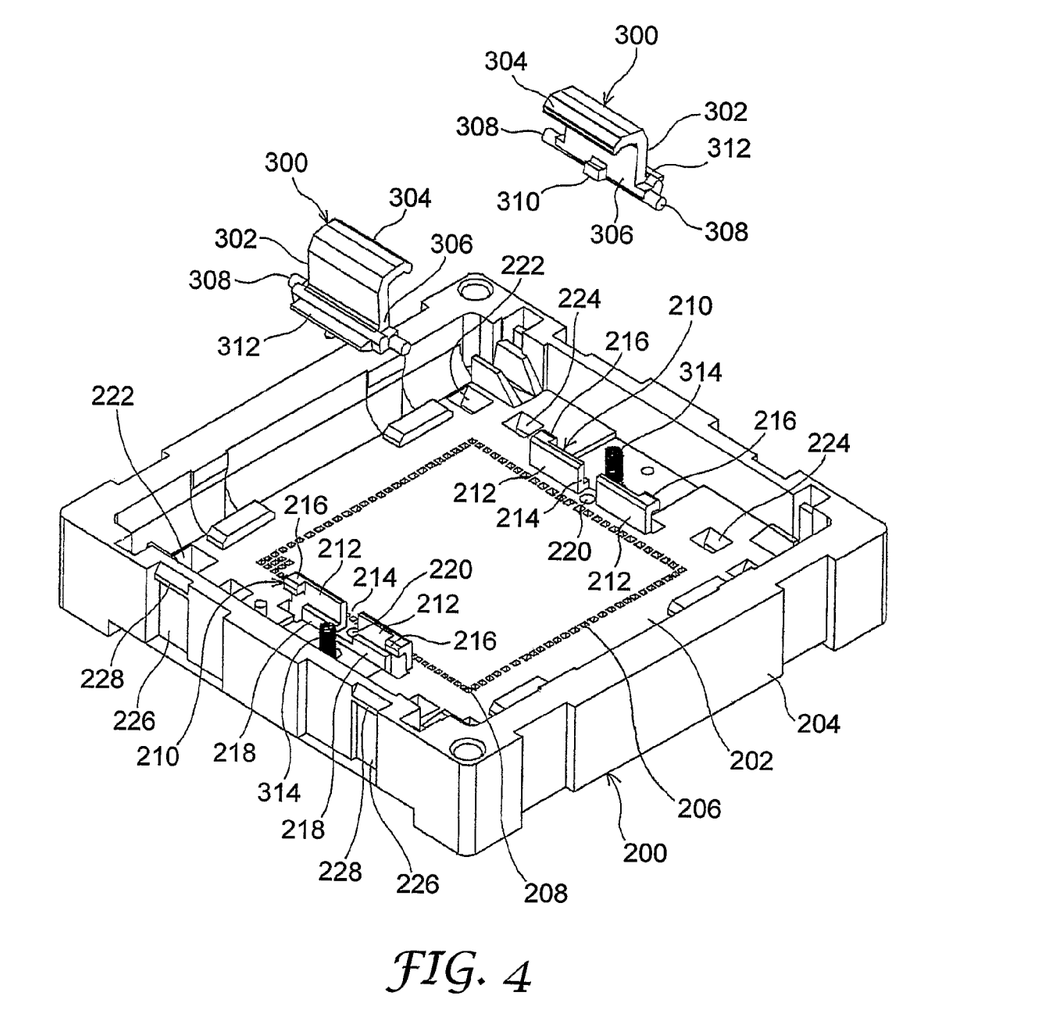
FIG. 4 is a perspective view of the base and the retainers of socket shown in FIG. 1.

As indicated in FIG. 4, the base 200, which is made of electrically non-conductive material, has a rectangular bottom portion 202 and peripheral walls 204 surrounding the bottom portion 202. The bottom portion 202 has a rectangular contact alignment region 206 corresponding to the contact alignment region 102 of the alignment plate 100. Similar to the contact alignment region 102 of the alignment plate 100, the contact alignment region 206 has a number of contact alignment holes 208 arranged in a grid, at the regular intervals in the orthogonal X- and Y-directions.

Figure 5:
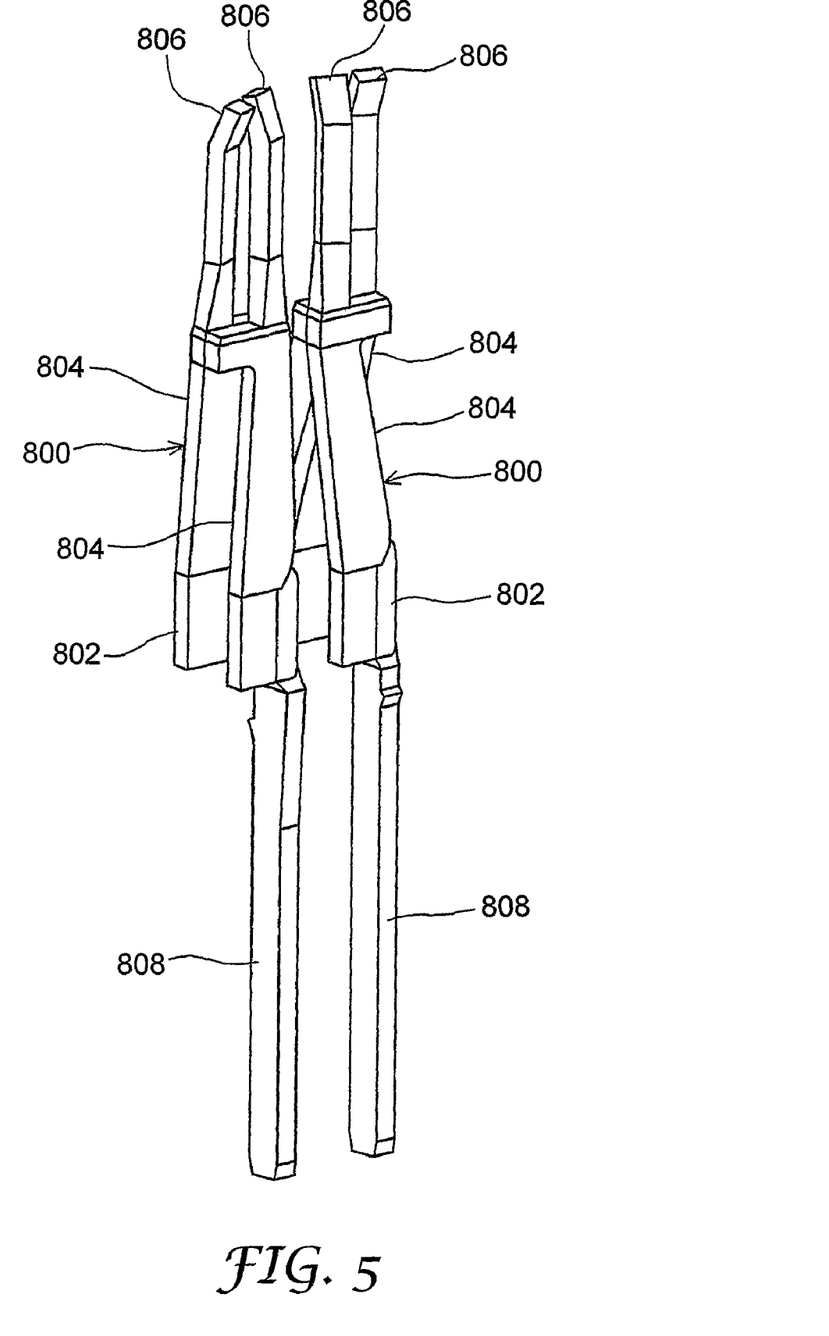
FIG. 5 is an enlarged perspective view of the contacts provided in the socket shown in FIG. 1.

FIG. 5 shows an embodiment of the contact 800. The illustrated contact 800, which is made of electrically conductive material, has a central portion 802 in the form of "U" when viewed from above. The opposite ends of the central portion 802 are extended upward to form a pair of cantilever arms 804 each of which terminate at tip portions 806. A part of the central portion 802 is extended downward to form a leg 808. Each contact 800 is securely held by the base 200 with the central portion 802 fitted within the contact alignment hole 208, so that the cantilever arms 804 and the tips 806 are projected from the top surface of the base and the legs 808 are projected from the bottom surface of the base.

As indicated in FIGS. 3 and 4, the base 200 further has a pair of retainer supports 210 positioned outside the contact alignment region 206 to oppose to each other across the region 206. Each retainer support 210 has a pair of vertical walls 212 positioned in line and parallel to the adjacent peripheral edge of the region 206, defining a vertical slot 212 therebetween. Each of the walls 212 has on its back an upper engagement portion 216 and a lower engagement portion 218, both projected rearward therefrom. In addition, provided below the vertical slot 214 and outside the contact alignment region 206 is a through-hole 220 extending vertically through the bottom portion 202 of the base.

As shown in FIG. 3, the alignment plate 100 and the base 200 are assembled with each other. In this assembling, the legs 808 of the contacts projected from the bottom surface of the base are each passed through the associated contact alignment holes 104 of the alignment plate 100 to protrude downward. When assembled, the through-holes 220 of the bottom portion 202 of the base are properly aligned in line with the associated through-holes 106 of the alignment plate 100. This in turn means that the through-holes 106 of the alignment plate 100 and the through-holes 220 are so positioned that they oppose to each other in the assembled condition.

Preferably, the assembling of the alignment plate 100 and the base 200 is attained by means of a snap-fit mechanism made of, for example, four vertical legs 108 of the alignment plate 100 and the corresponding four recesses or through-holes 222 of the base 200 into each of which the legs 108 are inserted for engagement.

As shown in FIG. 4, the retainer 300 has a main portion 302 in the form of substantially inversed "J" or "L" with a distal end 304 projected forwardly from its top portion. The main portion 302 has a proximal end portion 306 with a pair of bearing shafts 308 projecting from its left and right edges. The proximal end 306 further has a front projection 310 which projects from a central, front surface portion thereof and a rear projection 312 which projects from a central, rear surface portion thereof.

Figure 7:
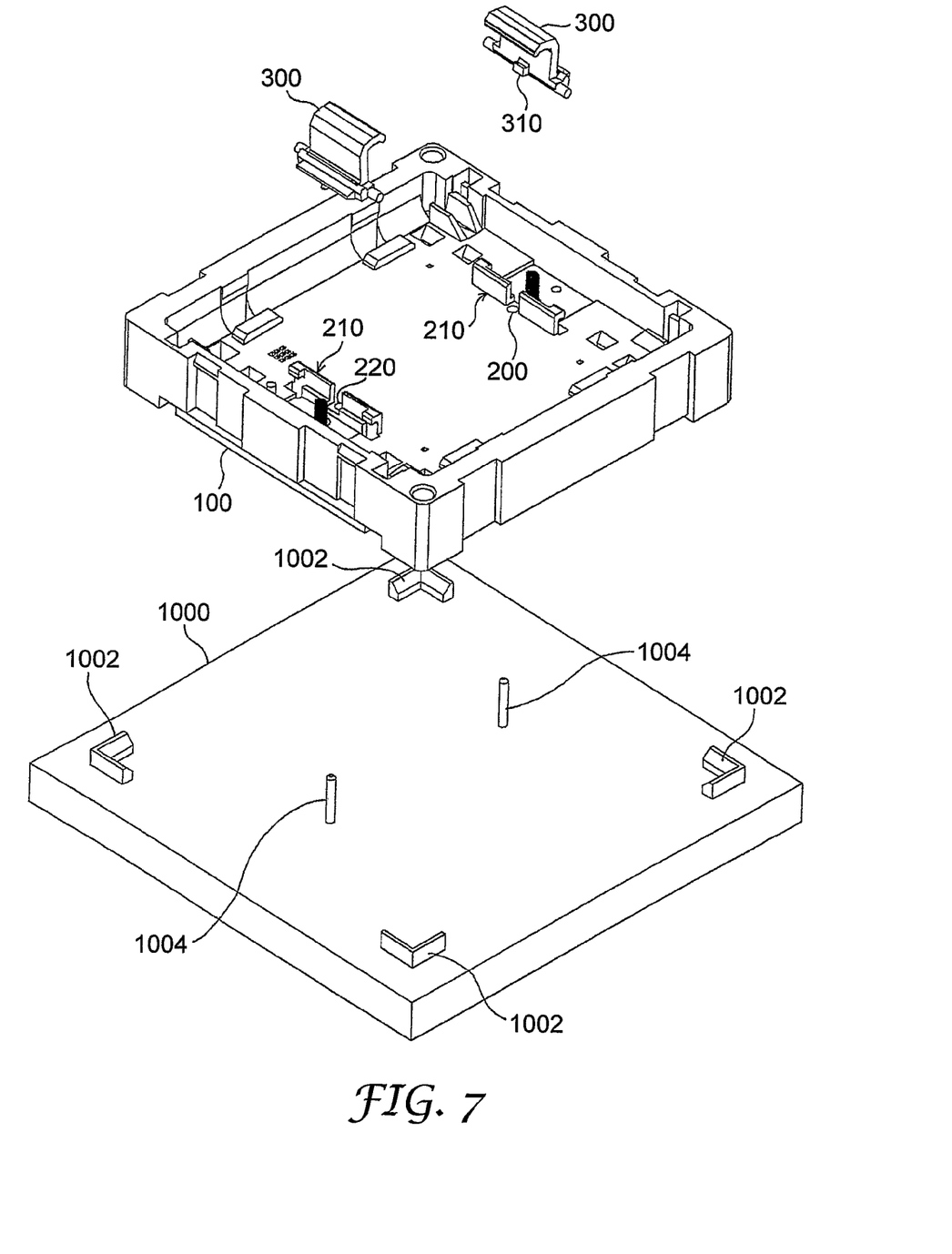
FIG. 7 is a perspective view of a part of the socket and the socket base.

Each of the retainer 300 is assembled to the retainer support 210 of the base 200 with the main portion 302 positioned behind the vertical walls 212 and each of the left and right bearing shafts 308 engaged between the upper and lower engagements 216 and 218, so that the retainer 300 is supported for rotation between a first position or projected position in which the distal end 304 projects above the contact alignment region 208 of the base 200 (see FIG. 2) and a second position or retracted position the distal end 304 stays outside the contact alignment region 208 (see FIG. 7). In the assembled state, the forward projection 310 stays within the vertical slot 214 and above the through-hole 220 when the retainer 300 takes the projected position. A biasing means or spring 314 is provided for each retainer and positioned between the base 200 and the rear projection 310 of the retainer so that the retainer 300 is biased and retained in the projected position while the main portion 302 is forced against the vertical walls 212.

As indicated in FIG. 3, the nest assembly 400 has a pair of comb structures 402 as described in U.S. Pat. No. 5,498,970. Each of the comb structures 402, which is made of electrically non-conductive material, has an end frame portion 404 and a plurality of parallel cantilever racks 406 extending orthogonally therefrom. A gap defined between the neighboring racks 406 is slightly larger than the width of the cantilever rack so that the comb structures 402 can be assembled to each other with each of the cantilever racks of one comb structure 402 positioned between the neighboring cantilever racks of the other comb structure 402.

Figure 6A:
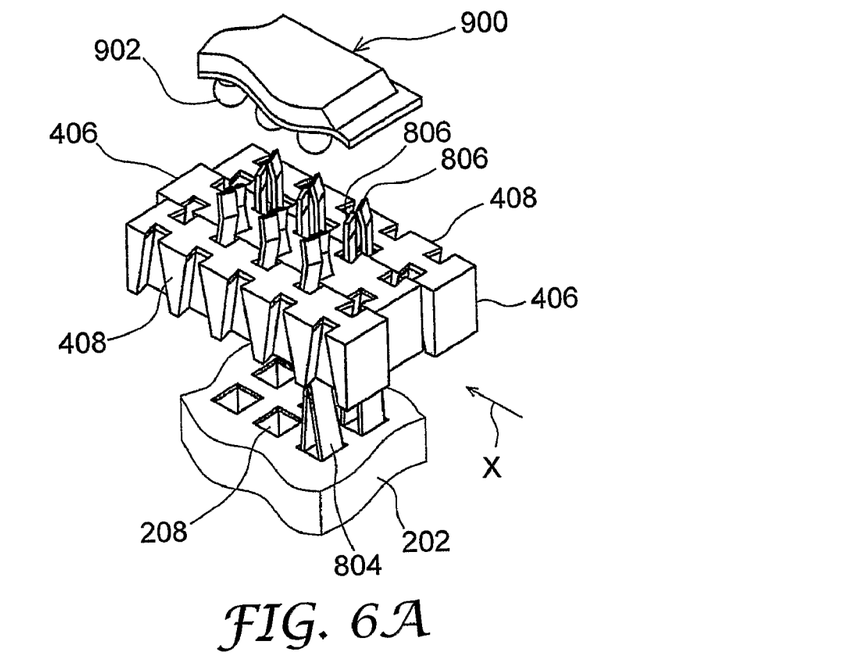
FIG. 6A is a partial enlarged perspective view showing a movement of a nest assembly and contacts, in which the contact tips take a free state.
Figure 6B:
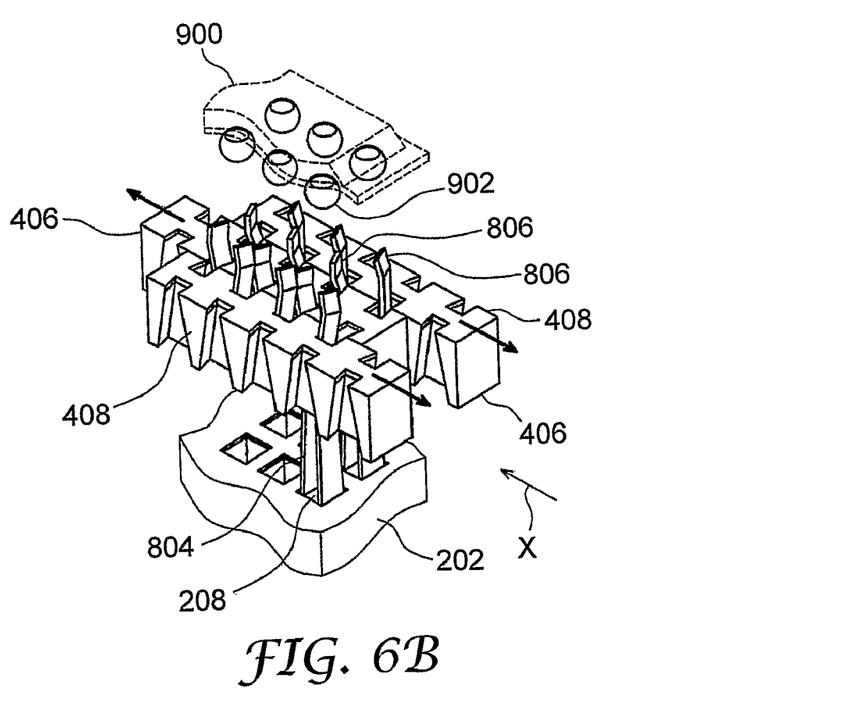
FIG. 6B is a partial enlarged perspective view showing a movement of the nest assembly and contacts, in which the contact tips take an open state.
Figure 6C:
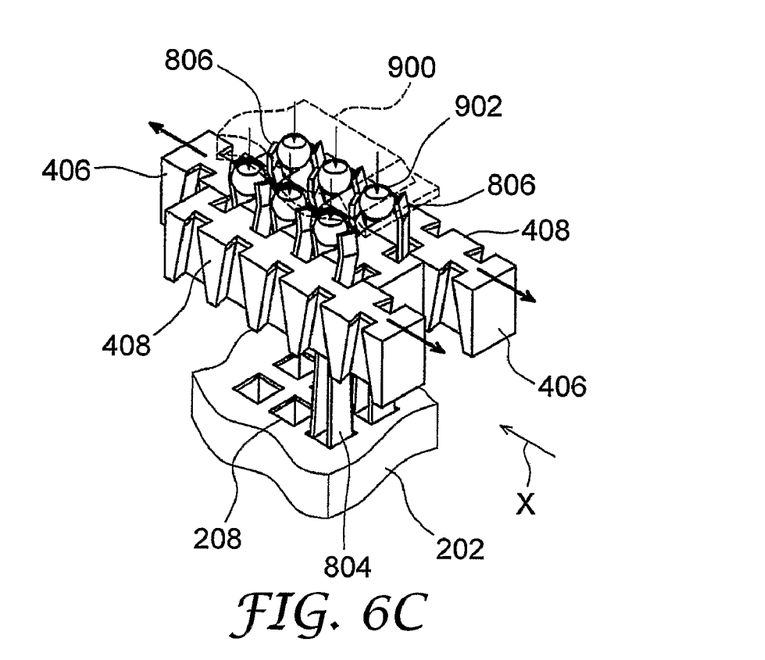
FIG. 6C is a partial enlarged perspective view showing a movement of the nest assembly and contacts, in which the contact tips are moving from the free state to the closed state.
Figure 6D:
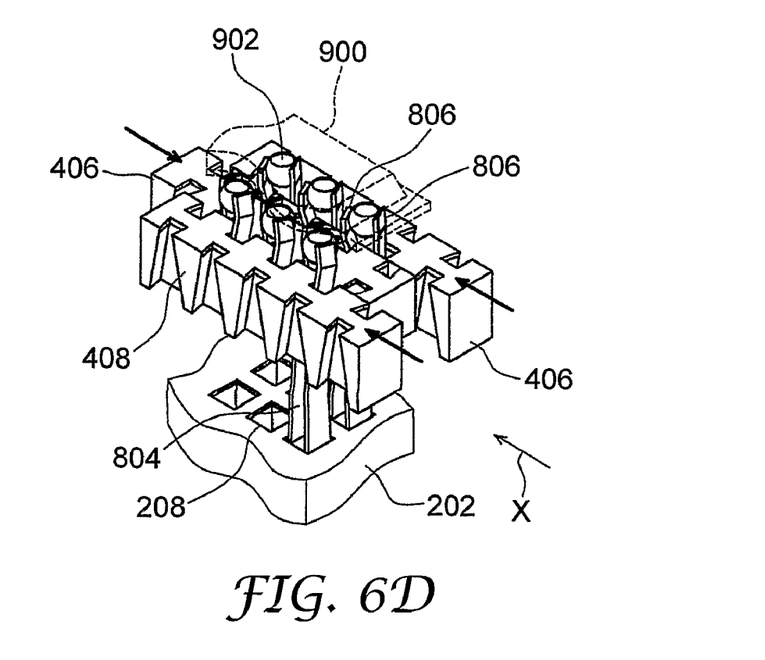
FIG. 6D is a partial enlarged perspective view showing a movement of the nest assembly and contacts, in which the contact tips are moving from the closed state to the open state.

The nest structures 402 are oriented in opposite directions and then assembled with each of the cantilever arms 406 of one nest structure 402 positioned between the each neighboring cantilever arms 406 of the other nest structure 402 to form the nest assembly 400. The nest assembly 400 so assembled is placed on the base 200 with the cantilever arms 406 oriented in the X-direction. As indicated in FIG. 6A, ones of the contact tips 806 are located between the neighboring projections 408 of the racks 406 of one comb structure 402 and the other ones of the tips 806 are located between the neighboring projections 408 of the racks 406 of the other comb structure 402. As indicated in FIGS. 6A-6D, this allows that, by forcing the comb structures 402 close to each other in the X-direction against the resiliency of the cantilever arms 804, each pair of contact tips 806 is forced from a free state (see FIG. 6A) to an open state (see FIG. 6B), creating a larger space therebetween having a size sufficient for receiving a terminal or solder ball 902 provided on the major surface (e.g., bottom surface) of the integrated circuit device 900.

To ensure the relative movement of the comb structures 402, the nest assembly 400 is connected to the base 200 so that at least one of the comb structures 402 can move to and from the other. For example, as shown in FIG. 3, each of the comb structures 402 has engagement legs 410 at opposite ends of the end frame portion 40. The base 200, on the other hand, has four engagement holes 222 to each of which the engagement legs 410 are inserted. The size of the engagement holes 222 in the X-direction is larger than that of the legs 41 so that the legs 410 can move in that direction within the associated engagement holes 222. This allows the relative movement of the comb structures 402 between two positions corresponding to the free and open states.

The package guide 500, which is made of electrically non-conductive material and is used for guiding the BGA integrated circuit device into a proper position of the nest assembly 400, has a rectangular frame 502 defining a rectangular opening region 504 which corresponds to the external configuration of the integrated circuit device. The package guide 500 is assembled to the base 200 to which the nest assembly 400 has been mounted. In this assembled state, the tips 806 of the contacts held by the nest assembly 400 are exposed within the opening region 504, allowing the contacts 800 to hold the corresponding solder balls 902 on the bottom surface of the integrated circuit device 900 placed within the opening 504 (FIGS. 6A to 6D). Preferably, four inner edges of the rectangular frame 502 have respective surface portions 506 each inclined downwardly and inwardly to ease the insertion of the integrated circuit device into the opening 504. Also preferably, the frame portions 508 running in the X-direction have downwardly extended cutouts 510 to ensure rearward rotations of the retainers 300. Further preferably, the package guide 500 has restrictions 512 which restrict the rearward movements of the bearing shafts 308 retained by the retainer supports 210 of the base 200. Furthermore, the package guide 500 is preferably secured to the nest assembly 400 using the legs 514 of the package guide 500 (only two of which are illustrated in FIG. 3) and the recesses 224 of the base 200 into which the legs 514 are engaged.

Referring to FIG. 3, the lever assembly 600 has a pair of substantially U-shaped brackets 602. Each bracket 602 has a transverse member 604 in the form of place extending in the Y-direction and sides arms 606 each extending substantially perpendicularly from either end of the transverse member 602. The brackets 602 are so assembled with each other that the arms 604 of one bracket intersect obliquely with those of the other. The assembled lever assembly 600 is then mounted on the base 200 so that each of the transverse members 604 is positioned between the end frame 404 of the nest assembly 400 on the base 200 and the opposed side wall of the base 200, with the arms 606 oriented obliquely and upwardly. This ensures that, when the distal ends of the arms 606 are depressed downward, the transverse members 604 rotate about their longitudinal axes to force the end frames 404 of the nest assembly 400 toward each other, which results in that the tips 806 of each contact 800 are changed from the free state to the open state. When, on the other hand, the depressing force is eliminated, the tips 806 of each contact 800 are moved from the open state to the free state due to the resiliency of the contacts.

The top cover 700, which is made of electrically non-conductive material, has a rectangular frame 702 defining therein an opening 704 which is so sized and shaped that the integrated circuit device 900 can pass therethrough and is assembled on the base 200 on which the nest assembly 400, the guide frame 500 and the lever assembly have been already assembled thereto. To allow the top cover 700 to move vertically between an elevated position (see FIG. 1) and a lowered position (not shown), relative to the base 200, the top cover 700 has a plurality of downwardly extending legs 706 and the base 200 has in its outer peripheral surfaces a plurality of vertical grooves 226 in each of which the legs 706 of the top cover 700 are slidably engaged. The inner surface of each leg 706 has an engagement portion 712 and the associated base groove 226 has in its top portion a projection 228 to which the engagement portion 712 will be engaged to inhibit the top cover 700 from elevating beyond its elevated position. A plurality of biasing springs 708 are provided between the top cover 700 and the base 200, so that the top cover 700 is normally forced in the elevated position. The top cover 700 further has a pair of downwardly extending actuators 710 capable of engaging with the rearward projections 312 of the retainers 300 to move the retainer 300 from the projected position back to the retracted position due to the downward movement of the top cover 700 from the elevated position to the lowered position.

When testing the BGA integrated circuit device 900 using the socket 10, as shown in FIGS. 6A to 6D, the legs 808 of the contacts 800 extending from the bottom surface of the alignment plate 100 are electrically connected to the testing circuit not shown. In this state, the top cover 700 is depressed to force the distal ends of the arms 606 of the lever assembly 600 downwardly, which rotates the transverse portions 604 of the lever assembly 600 rotate about respective longitudinal axes to force end frame portions 404 of the nest assembly 400 to each other. This results in that the actuators 710 of the top cover 700 depress the rearward projections 312 of the retainers 300, which rotates the retainers 300 from the projected positions to the retracted positions. Also, each gap defined by the opposed tips 806 of each contact 800 is enlarged, in which each of the solder balls 902 mounted on the bottom surface of the integrated circuit device 900 is accommodated (see FIG. 6A-6D).

When the depressing force is removed, the top cover 700 returns to the elevated position due to the biasing force from the springs 708. As a result, the comb structures 402 are moved back to a closed state due to the resiliency of the cantilever arms 804 of the contacts 800, in which each solder ball 902 is nipped by the obliquely opposed tips 806 of the contacts and thereby the integrated circuit device 900 is electrically connected to the test circuit not shown. Also, the retainers 300 rotate from the retracted positions to the projected positions where the tips 304 of the retainers make forcing contacts with the respective portions of the integrated circuit device 900. Preferably, the retainers 300, in particular the tips 304 are so shaped and sized that the tips 304 are brought into contact with the upper surface portions where the tips 304 oppose the solder balls 902, which prevents an unwanted upward warpage of the central portion of the integrated circuit device which would otherwise be caused if the tips 304 of the retainer 300 depress a region outside the solder balls and prevents the resultant unreliable connections between the contact tips 806 and the solder balls 902 of the contacts in its central region.

After the completion of the test for the integrated circuit device 900, the top cover 700 is again depressed to lower the distal ends of the arms of the lever assembly 600, which causes the contact tips 806 to move from the closed state to the open state. At this moment, the retainers 300 rotate from the projected positions to the retracted positions. This allows the integrated circuit device 900 to be removed from the socket 10 to lose contacts with the associated contacts.

When testing whether each pair of opposed contact tips 806 defines a predetermined size of gap or opening therebetween, the socket 10 is mounted on a socket base 1000 indicated in FIG. 7. The socket base 1000, which is made of electrically non-conductive material, has, for example, four positioning portions 1002 provided according to the outer configuration of the base 200. The socket base 1000 also includes two actuation rods or pins 1004 extending upwardly from the socket base 1000 within a region surrounded by the four positioning portions 1002. The actuation pins 1004 are positioned at respective places where both the through-holes 106 of the alignment plate and the associated through-holes 220 of the base aligned therewith oppose when the socket 10 is positioned on the socket base 1000 by means of the positioning portions 1002.

Figure 8:
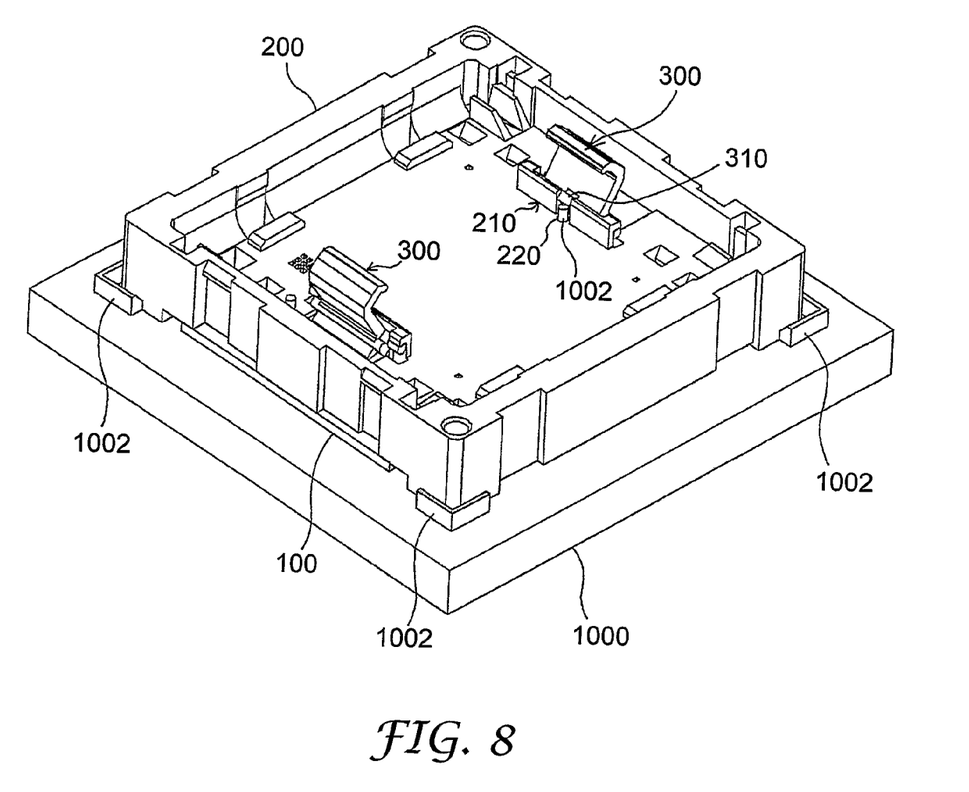
FIG. 8 is a partial perspective view showing the socket mounted on the socket base.
Figure 9A:
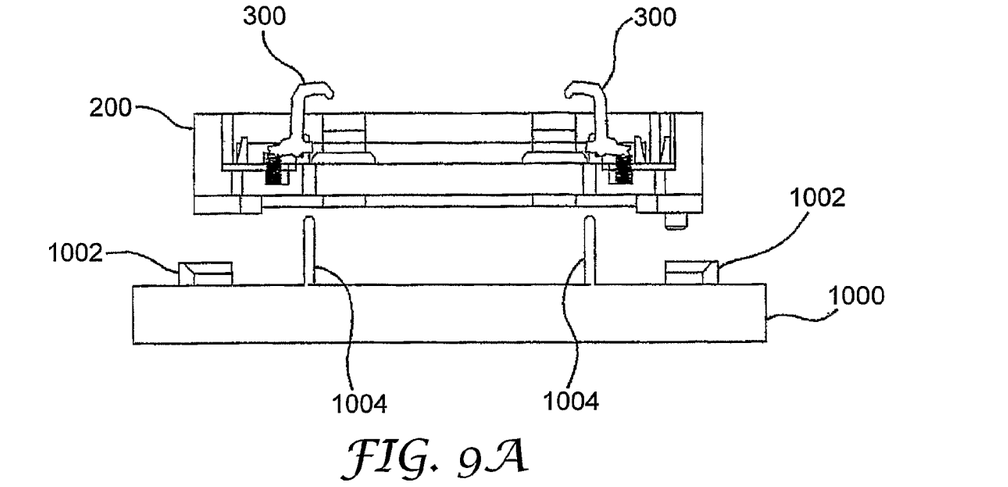
FIG. 9 is a diagram showing a movement for mounting the socket onto the socket base.
Figure 9B:
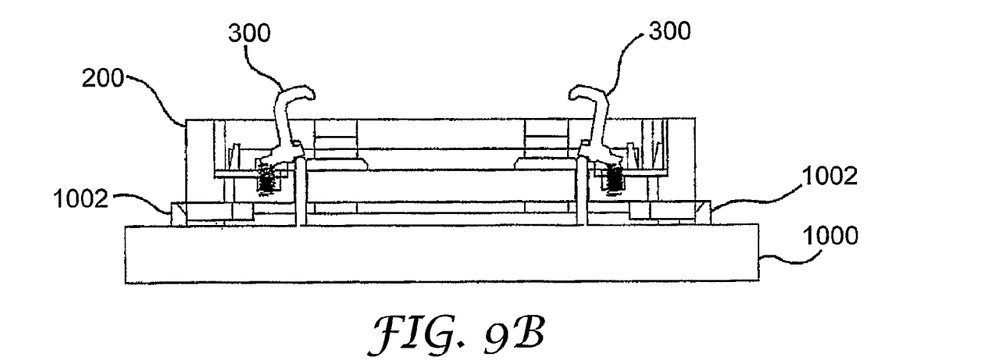
Figure 9C:
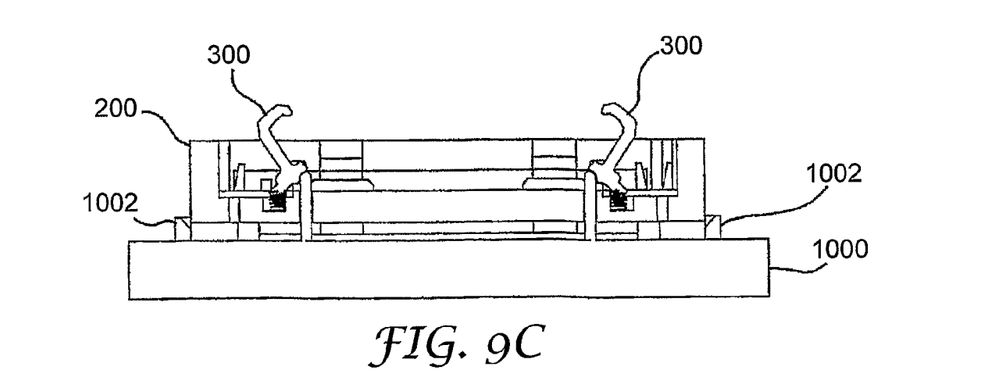

At measuring gaps of the contact tips, the socket 10 is mounted on the socket base 1000. At this moment, the socket 10 is properly positioned by the four positioning portions 1002. As shown in FIGS. 8 and 9, this causes that the actuation pins 1004 are passed through the through-holes 106 of the alignment plate and also the through-holes 220 of the base and then projected therefrom above the bottom portion 202 of the base, forcing the retainers 300 on the through-holes 220 of the base upward against the biasing forces derived from the springs 314. This results in that the retainers 300 rotate from the projected positions back to the retracted positions and the distal end portions 304 of the retainers are moved away from the region positioned above the contacts 800, which ensures that all the gaps of the contact tips to be reliably measured by means of an image pickup device such as camera (not shown). After the completion of the gap measurement, the socket 10 is removed from the socket base, which returns the retainers 300 into the projected positions due to the biasing forces from the springs 314.

In view of the foregoing, the socket according to the present invention causes the retainers 300 to be moved from the projected positions to the retracted positions simply by mounting the socket 10 onto the socket base 1000, without using any purpose-built specific tools designed for moving and then keeping the retainers 300 at the retracted positions, before mounting the socket onto the socket base. Also, the measurement of the gaps is significantly simplified.

The description of the invention is merely exemplary in nature and, thus, variations that do not depart from the gist of the invention are intended to be within the scope of the invention. Such variations are not to be regarded as a departure from the spirit and scope of the invention.

The invention claimed is:

1. A socket for an integrated circuit device, the socket having a plurality of contacts corresponding to a plurality of terminals mounted on a major surface of the integrated circuit device, comprising:
   a base for supporting said contacts;
   a plurality of retainers, each of said retainers being mounted on said base for movement between a projected position in which said retainer is projected into a region above said integrated circuit device mounted on said contacts to make a contact with an upper surface portion of said integrated circuit device and a retracted position in which said retainer is retracted out of said region above said integrated circuit device; and
   a plurality of springs, each of said springs being provided for biasing said retainer from said retracted position to said projected position;
   wherein said base has a plurality of through-holes extending through said base, said through-holes being so positioned that, when pins are passed upwardly through said through-holes, respectively, said retainers are forced by said pins from said projected positions to said retracted positions.

2. A socket base for supporting said socket of claim 1, wherein said socket base has said pins.

3. A method for operating retainers of a socket for an integrated circuit device, comprising the steps of:
   (a) providing a socket including a base having through-holes extending through said base, a plurality of contacts mounted in said base, retainers mounted for movement between respective first positions in which said retainers are positioned above an integrated circuit device mounted on said contacts to retain said integrated circuit device on said contacts and respective second positions in which said retainers are retracted from above said integrated circuit device to release said integrated circuit device and springs for biasing said retainers from said respective second positions to said respective first positions;
   (b) providing a socket base for supporting said socket, said socket base having pins corresponding to said through-holes;
   (c) mounting said socket on said socket base so that said pins of said socket base are passed through said corresponding through-holes of said base to force said retainers from said respective first positions to said respective second positions against said springs; and
   (d) removing said socket from said socket base.

4. A method for testing a socket for an integrated circuit device, comprising the steps of:
   (a) providing a socket having a base having through-holes extending through said base, a plurality of contacts mounted in said base, retainers mounted for movement between respective first positions in which said retainers are positioned above an integrated circuit device mounted on said contacts to retain said integrated circuit device on said contacts and respective second positions in which said retainers are retracted from above said integrated circuit device to release said integrated circuit device and springs for biasing said retainers from said respective second positions to said respective first positions;

(b) providing a socket base for supporting said socket, said socket base having pins corresponding to said through-holes;

(c) mounting said socket on said socket base while said pins of said socket base are passed through said corresponding through-holes of said base to force said retainers from said respective first positions to said respective second positions against said springs; and (d) removing said socket from said socket base.

* * * * *